United States Patent [19]

Yanase

[11] 4,414,648
[45] Nov. 8, 1983

[54] MAGNETIC BUBBLE DOMAIN SWAP GATE CIRCUIT

[75] Inventor: Takeyasu Yanase, Yokohama, Japan

[73] Assignee: Fumitsu Limited, Kawasaki, Japan

[21] Appl. No.: 253,522

[22] PCT Filed: Jul. 16, 1980

[86] PCT No.: PCT/JP80/00159

§ 371 Date: Mar. 17, 1981

§ 102(e) Date: Mar. 11, 1981

[87] PCT Pub. No.: WO81/00322

PCT Pub. Date: Feb. 5, 1981

[30] Foreign Application Priority Data

Jul. 17, 1979 [JP] Japan .................................. 54-90647

[51] Int. Cl.³ .............................................. G11C 19/08
[52] U.S. Cl. ........................................ 365/16; 365/12
[58] Field of Search .................... 365/15, 16, 43, 12

[56] References Cited

U.S. PATENT DOCUMENTS

| | | | |
|---|---|---|---|
| 4,020,476 | 4/1977 | Bonyhard et al. | 365/16 |
| 4,079,461 | 3/1978 | George et al. | 365/15 |
| 4,094,005 | 6/1978 | Chen | 365/16 |
| 4,263,661 | 4/1981 | Chen et al. | 363/15 |

OTHER PUBLICATIONS

IEEE Transactions on Magnetics–vol. Mag-13, No. 6, Nov. 1977, p. 1785.
IEEE Transactions on Magnetics–vol. Mag-12, No. 6, Nov. 1976, pp. 614–617.
IEEE Transactions on Magnetics–vol. Mag-15, No. 6, Nov. 1979, pp. 1692–1696.

Primary Examiner—James W. Moffitt
Attorney, Agent, or Firm—Staas & Halsey

[57] ABSTRACT

A magnetic bubble domain swap gate circuit (28) for use with a magnetic bubble element having an information transmission line along which magnetic bubble domains are transferred and an information storage loop in which magnetic bubble domains are stored, wherein a magnetic bubble domain in the information transmission line can be transmitted to the information storage loop and a magnetic bubble domain in the information storage loop can be simultaneously transmitted to the information transmission line. The repetition period of the magnetic substance patterns which form the information transmission line, is greater than the period of the magnetic substance patterns forming the information storage loop. If A designates the outlet of the information transmission line (21) to the information storage loop, B designates the inlet of the information transmission line from the information storage loop, C designates the outlet of the information storage loop to the information transmission line, and D designates the inlet of the information storage loop from the information transmission line, the bit-length intervals, or number of times that a magnetic bubble domain must be moved by the magnetic field of the magnetic bubble element between two of these points are related in the following manner. AB≦CD, AD=CD, AB=BC. Thus, the region necessary to form the magnetic bubble domain swap gate circuit is enlarged and the pattern width of the transmission control conductor pattern is increased, so that a sufficient operational margin is obtained.

22 Claims, 19 Drawing Figures

Fig. 4A
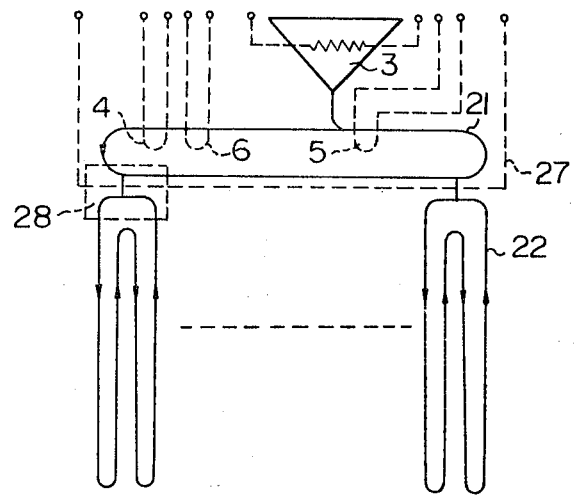
Fig. 4B  Fig. 4D  Fig. 4F
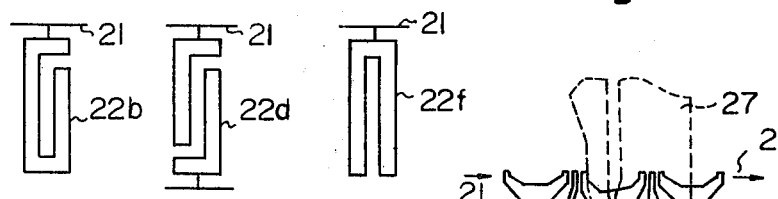
Fig. 5
Fig. 4C  Fig. 4E
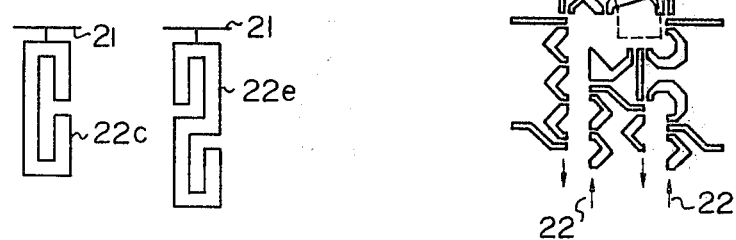

MAGNETIC BUBBLE DOMAIN SWAP GATE CIRCUIT

BACKGROUND OF THE INVENTION

The present invention relates to a magnetic bubble domain memory device. More particularly, the present invention relates to a magnetic bubble domain swap gate circuit for exchanging a magnetic bubble domain between a major loop acting as an information transmission line and a minor loop acting as an information storage loop.

In electronic computers, the reduction of dimensions and the increase of processing speeds have recently been remarkably accelerated by prominent developments in electronic techniques, such as the technique of semiconductor integrated circuits. Furthermore, the reliability of electronic computers has been remarkably improved by the adoption of solid state circuit elements. With the recent developments, memory capacities have been increased year after year, and reduction of the unit price necessary for memory devices and shortening of the access time have eagerly been sought in the art.

A non-volatile large-capacity memory device having a high reliability is necessary for storing and holding reliably a large quantity of information but it is impossible to fabricate such a memory device using volatile semiconductor storage elements. Furthermore, although a magnetic tape device or magnetic disk device is non-volatile, such devices have a fatal defect in that they involve movable parts. Accordingly, such memory devices are not capable of satisfying the requirement of high reliability. On the other hand, magnetic bubble devices have been widely used as non-volatile large-capacity memory devices having high reliability.

When a bias magnetic field of an appropriate amplitude is vertically applied to the surface of a thin magnetic layer having a uniaxial magnetic anisotropy, such as a thin layer of garnet or orthoferrite, a cylindrical magnetic domain, that is, a so-called "magnetic bubble," is produced. Practical applications for magnetic bubble devices, for performing storage of information and logic operations by utilizing such magnetic bubbles, have been rapidly developed in the fields where characteristics of these magnetic bubble devices (such as non-volatility, solid state of entire elements, the possibility of increased capacity and relatively high speed) are desired.

A magnetic bubble device is required to have the functions of generation, propagation, replication, gate circuit, stretch, detection and annihilation of magnetic bubbles. Furthermore, the device should have bias magnetic field applying means for making a magnetic bubble stable in the thin magnetic layer and rotating magnetic field applying means for transferring the magnetic bubble in the thin magnetic layer to the base of a magnetic pattern formed on the thin magnetic layer. Such a magnetic bubble memory device is disclosed in, for example, D. C. Bullock et al., Design and Fabrication of Large Capacity Bubble Memory Devices, IEEE Transactions on Magnetics, Vol. MAG. 15, No. 6, November 1979.

A magnetic bubble domain swap gate circuit used in such a conventional magnetic bubble memory device, in which the diameter of the magnetic domain is now remarkably reduced, involves various problems. More specifically, in the conventional magnetic bubble device, in order to increase the density it is necessary to reduce the diameter of the bubble domain, and with this reduction, it becomes necessary to reduce the dimensions of the permalloy patterns constituting the loops for transmission of the magnetic bubble domains and also to reduce the distance between every two permalloy patterns. Accordingly, the region for forming the magnetic bubble domain swap gate circuit is inevitably diminished, and it is difficult to increase the pattern width of the transmission control conductor pattern beyond a certain value. If the pattern width of the transmission control conductor pattern is narrowed, in order to inhibit the occurrence of ion migration or the like, it is inevitably necessary to reduce the density of the electric current to be supplied to the pattern. Therefore, the current capacity of the transmission control conductor pattern is reduced to such an extent that the necessary operational margin can hardly be obtained.

SUMMARY OF THE INVENTION

It is therefore a primary object of the present invention to solve the foregoing problems involved in the magnetic bubble domain swap gate circuit in the conventional magnetic bubble device.

In accordance with the present invention, this object can be attained by a magnetic bubble domain swap gate circuit comprising an information transmission line (major loop) for transmitting a magnetic bubble domain and an information storage loop (minor loop) for storing the magnetic bubble domain, wherein the magnetic bubble domain in the information transmission line is transmitted to the information storage loop and simultaneously, the magnetic bubble domain in the information storage loop is transmitted to the information transmission line, said magnetic bubble domain swap gate circuit being arranged so that in the information transmission line (having longer pattern elements than the pattern elements forming the information storage loop) and in the information storage loop, the following relations are established in bit length spacings:

$$AB \leq CD,$$

$$AD = CD \text{ and}$$

$$AB = BC,$$

wherein A represents the outlet of the information transmission line to the information storage loop, B represents the inlet of the information transmission line from the information storage loop, C represents the outlet of the information storage loop to the information transmission line and D represents the inlet of the information storage loop from the information transmission line.

BRIEF DESCRIPTION OF THE DRAWINGS

FIGS. 4A, 4B, 4C, 4D, 4E and 4F are diagrams showing the structure of a magnetic bubble device to which the magnetic bubble domain swap gate circuit according to the present invention is applied;

FIG. 5 is a plan view showing one embodiment of the magnetic bubble domain swap gate circuit according to the present invention;

DESCRIPTION OF THE PREFERRED EMBODIMENTS

The preferred embodiments of the present invention will now be described in detail with reference to the accompanying drawings.

Figure 1:
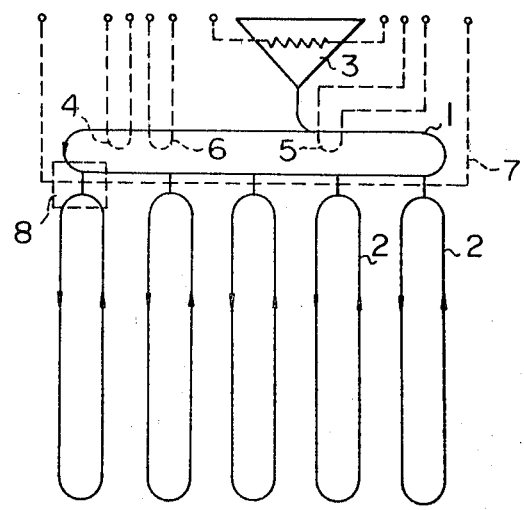
FIG. 1 is a diagram illustrating the general structure of a conventional magnetic bubble device.

A typical structure of a magnetic bubble chip heretofore used for the magnetic bubble device is illustrated in FIG. 1.

The illustrated structure comprises so-called major and minor loops. In FIG. 1, reference numeral 1, 2, 3, 4, 5, 6 and 7 represent respectively a major loop acting as the information transmission line, minor loops acting as information storage loops, a detector, a generator, a replicator, an eraser and a transmission control conductor pattern. Incidentally, in the drawings, the magnetic bubble transmission lines represented by solid lines are composed of permalloy patterns formed on a magnetic bubble thin layer, and a broken line indicates a conductor line of gold formed on the magnetic bubble thin layer.

At first, an electric current is supplied in the loop of the conductor pattern constituting the generator 4 in a direction substantially weakening the bias magnetic field according to the information to be written, whereby a magnetic bubble is produced in said loop. The magnetic bubble so produced is transmitted on the major loop 1 by a driving magnetic field rotating in the in-plane direction of the magnetic thin layer, and the magnetic bubble is moved to a position confronting a minor loop 2. At this point, an electric current is supplied to the transmission control conductor pattern 7 (constituting a transfer gate), whereby the magnetic bubbles on the major loop 1 are fed into the respective minor loops 2. The magnetic bubble fed into each minor loop 2 is circulated in the minor loop 2 by the driving magnetic field, and storage of the information is thus completed.

Stored information is read as follows: When each of the magnetic bubbles in the respective minor loops, to be read, arrives at a position confronting the transfer gate 7 (that is, the transmission control conductor pattern 7) an electric current is supplied to this conductor pattern 7 to transfer the magnetic bubbles into the major loop 1. The line of magnetic bubbles thus transferred into the major loop is transmitted in succession to the replicator 5 by the driving magnetic field. In the replicator 5, each magnetic bubble is divided into two bubbles, and one is fed to the detector 3 along the permalloy pattern and the other bubble is fed to the minor loop again through the major loop 1. The detector 3 stretches the magnetic bubbles arriving here in succession so as to increase the detection efficiency, and the change of the resistance in a magnetoresistive element caused by the arrival of the magnetic bubble is read out in the form of, for example, a change of the voltage. Incidentally, if the information is to be erased after it is read and new information is to be written instead, the magnetic bubble formed by replication is erased by the eraser 6 on the major loop and the new information is written by the generator 4.

In the magnetic bubble device of FIG. 1 where the above-mentioned operations are conducted, in order to write new information in the minor loop 2, it is necessary to first erase the information in the minor loop 2 and then write this new information in the minor loop 2. If these erasing and writing operations are carried out sequentially the operational speed is reduced. However, the operational speed can be increased by performing a so-called magnetic bubble domain swap gate operation for transmitting new information to be written from the major loop 1 to the minor loop 2 simultaneously with the transfer of the information in the minor loop 2 to the major loop 1.

Figure 2A:
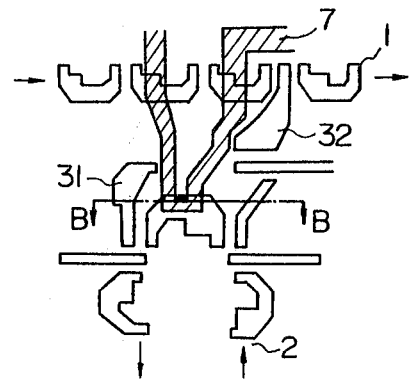
FIG. 2A is a plan view showing a conventional magnetic bubble domain swap gate circuit and FIG. 2B is a view showing the section taken along line B—B in FIG. 2A.
Figure 2B:
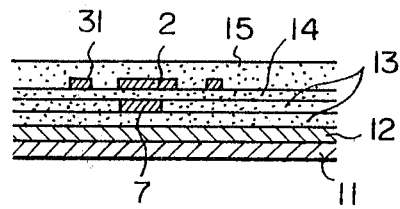

In FIG. 1, reference numeral 8 represents a magnetic bubble domain swap gate circuit for performing this operation. FIG. 2A is a plan view illustrating in detail the structure of the conventional magnetic bubble domain swap gate circuit 8 heretofore used for this purpose. In FIG. 2A, reference numerals 1, 2 and 7 represent the major loop, the minor loop and the transmission control conductor pattern, respectively. As is seen from FIG. 2A, the magnetic bubble domain swap gate circuit comprises parts of the permalloy patterns constituting the major loop 1 and minor loop 2, permalloy patterns 31 and 32 and the transmission control conductor pattern 7. FIG. 2B is a view showing the section taken along line B—B in FIG. 2A, which illustrates the interrelation among the major loop 1, the transmission control conductor pattern 7, the permalloy pattern 31, a gadolinium-gallium-garnet substrate (GGG substrate) 11, a garnet crystal 12 and insulating layers 13, 14 and 15.

FIGS. 3A through 3D are diagrams illustrating the operation of this magnetic bubble domain swap gate circuit.

Figure 3A:
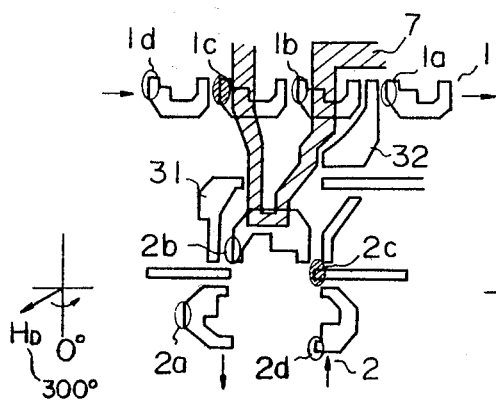
FIGS. 3A, 3B, 3C and 3D are diagrams illustrating the operation of the magnetic bubble domain swap gate circuit shown in FIG. 2A.

As shown in FIG. 3A, a control current is caused to begin to flow in the transmission control conductor pattern 7 when a rotating magnetic field $H_D$ is at the position of 300°. At this time, magnetic bubble domains 1a through 1d in the major loop 1 are located at the positions indicated in FIG. 3A, and also magnetic bubble domains 2a through 2d in the minor loop 2 are located at the positions shown in FIG. 3A. Magnetic bubble domains 1c and 2c, which are to be exchanged, are hatched with oblique lines.

Figure 3B:
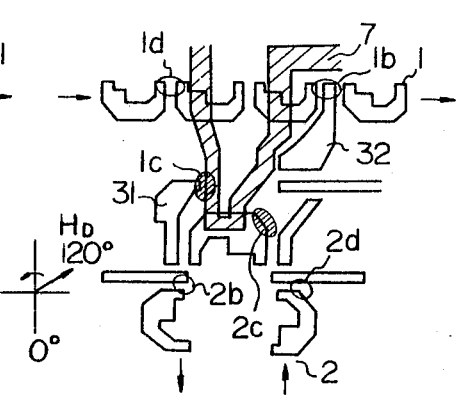

When the rotating magnetic field $H_D$ is rotated to the position of 120° shown in FIG. 3B, since the electric current is flowing in the transmission control conductor pattern 7 the magnetic bubble domain 1c in the major loop 1 is not moved along the major loop 1 but is moved instead toward the permalloy pattern 31. At this point, the other magnetic domains 1b, 1d, 2b, 2c and 2d in the major loop 1 and minor loop 2 are moved in these loops 1 and 2 to the positions indicated in FIG. 3B.

Figure 3C:
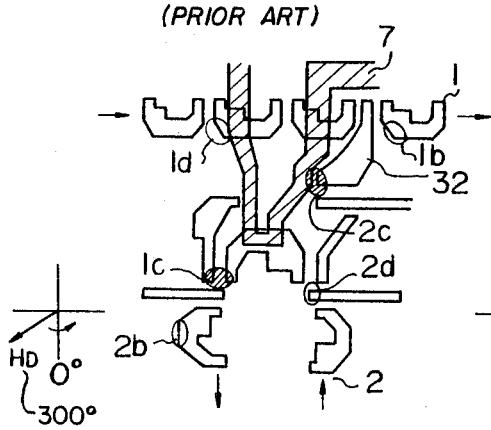

When the rotating magnetic field $H_D$ is rotated to the position of 300° shown in FIG. 3C, in the same manner as described above, the magnetic bubble domain 2c in the minor loop 2 is moved to the position of the permalloy pattern 32 by the current flowing in the transmission control conductor pattern 7, and the magnetic bubble domain 1c is transferred into the minor loop 2 from the major loop 1. At this point, the other magnetic bubble domains 1b, 1d, 2b and 2d are located at the positions shown in FIG. 3C.

Figure 3D:
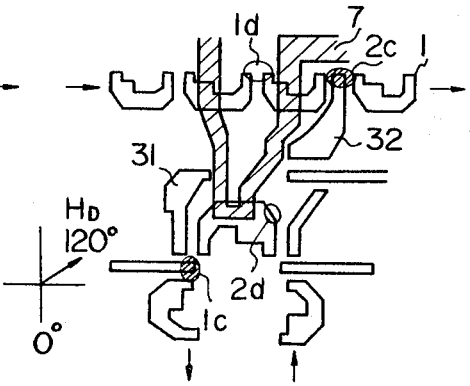

When the controlling current flowing in the transmission control conductor pattern 7 is cut and the rotating magnetic field $H_D$ is rotated to the position shown in FIG. 3D, the magnetic bubble domain 2c is transferred into the major loop 1. At this point, the other magnetic bubble domains 1d, 2d and 1c are located at the positions shown in FIG. 3D.

By the above-mentioned series of operations, the magnetic bubble domain 1c in the major loop 1 and the magnetic bubble domain 2c in the minor loop 2 are exchanged with each other; the magnetic bubble domains 1c and 2c are transferred into the minor loop 2 and major loop 1, respectively.

At this point, as is seen from the drawings, the magnetic bubble domains 1c and 2c which have been exchanged with each other have been transferred to the proper bit positions of the exchanged domains. More specifically, the domain 1c has been transferred to the bit position where the domain 2c would otherwise have been located, and the domain 2c has been transferred to the bit position where the domain 1c would otherwise have been located. This will readily be understood if FIG. 3A, illustrating the relation among the magnetic bubble domains before the exchange of the magnetic domains, is compared with FIG. 3D, showing the same relation after the exchange of the magnetic bubble domains.

In the conventional magnetic bubble domain swap gate circuit discussed above with reference to FIGS. 2A, 2B, 3A, 3B, 3C and 3D, various problems arise because of the recent tendency to reduce the diameter of the magnetic bubble domains, as pointed out hereinbefore.

FIG. 4A is a diagram illustrating the structure of the magnetic bubble device to which the present invention is applied, in which reference numerals 21, 22 and 28 represent a major loop, a minor loop and a magnetic bubble domain swap gate circuit, respectively. This magnetic bubble device is different from the conventional magnetic bubble device shown in FIG. 1 in that the minor loops 22 have a folded structure. This structure of the minor loops has already been proposed by us in a Japanese Patent Application. Adoption of this structure is advantageous in that the width of the minor loop 22 is increased near the portion which falls adjacent the major loop 21, and therefore the region for forming the magnetic bubble domain swap gate circuit, which is indicated by dotted lines, can be increased.

FIGS. 4B through 4F show other embodiments of the minor loop shown in FIG. 4A. In these Figures, reference numerals 22b, 22c, 22d, 22e and 22f represent minor loops.

FIG. 5 is a diagram illustrating in detail the magnetic bubble domain swap gate circuit 28 used in FIGS. 4A through 4F, in which reference numerals 21, 22 and 27 represent a major loop, a minor loop and a transmission control conductor pattern, respectively. The magnetic bubble domain swap gate circuit comprises the major loop 21, parts of the permalloy patterns constituting the minor loop 22, permalloy patterns 61 and 62 and the transmission control conductor pattern 27.

Figure 6A:
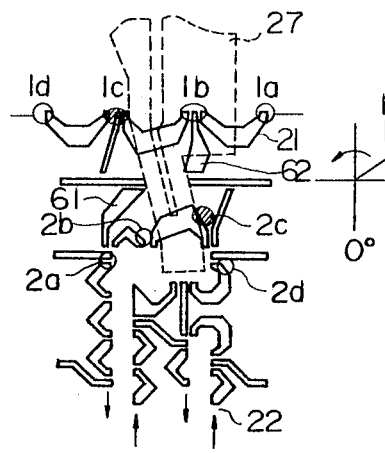
FIGS. 6A, 6B and 6C are diagrams illustrating the operation of the magnetic domain swap gate circuit shown in FIG. 5.
Figure 6B:
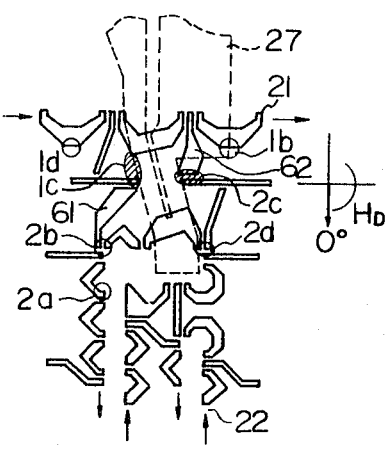
Figure 6C:
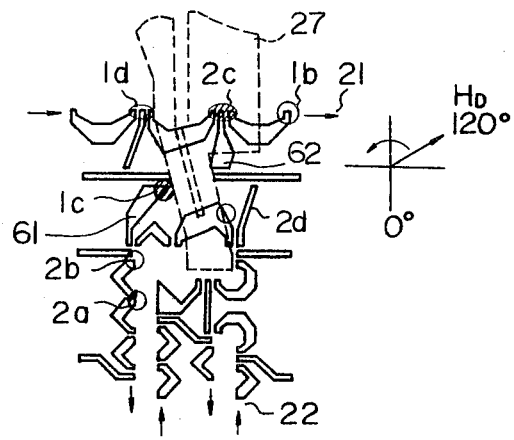

FIGS. 6A through 6C are diagrams illustrating the operations of this bubble magnetic domain swap gate circuit.

With reference to FIG. 6A, when the rotating magnetic field $H_D$ is located at the position of 120°, a control current begins flowing. At this point, magnetic bubble domains 1a through 1d in the major loop 1 are located at the positions shown in FIG. 6A, as are the magnetic bubble domains in the minor loop 2. The magnetic bubble domains 1c and 2c to be exchanged are hatched by oblique lines.

When the rotating magnetic field $H_D$ is located at the position of 120° shown in FIG. 6A, since an electric current is flowing in the transmission control conductor pattern 27, the magnetic bubble domain 2c in the minor loop 22 is not moved along the minor loop 22 but is moved instead toward the permalloy pattern 62, as shown in FIG. 6B. At this point, the other magnetic bubble domains 1b, 1c, 1d, 2b and 2d in the major loop 21 and minor loop 22 are moved in the respective loops and are located at the position shown in FIG. 6B.

When the rotating magnetic field $H_D$ is rotated to the position of 120° shown in FIG. 6C, the magnetic bubble domain 1c in the major loop 21 is moved to the position of the permalloy pattern 61 by the electric current flowing in the transmission control conductor pattern 27 in the same manner as described hereinbefore, and instead, the magnetic bubble domain 2c is transferred into the major loop 21 from the minor loop 22. At this point, the other magnetic bubble domains 1b, 1d, 2b and 2c are located at the positions shown in FIG. 6C.

When the control current flowing in the transmission control conductor pattern 27 is cut and the rotating magnetic field $H_D$ is rotated to the position of 0° (not shown in the drawings), the magnetic bubble domain 1c is transferred into the minor loop 22.

By the above series of operations, the magnetic bubble domain 1c in the major loop 21 is exchanged with the magnetic bubble domain 2c in the minor loop 22, so that the magnetic bubble domains 1c and 2c are transferred to the minor loop 22 and major loop 21, respectively. At this point, as is seen from the drawings, the magnetic bubble domains 1c and 2c are transferred to the proper bit positions of the exchanged domains. More specifically, the domain 1c is transferred to the bit position where the domain 2c would otherwise have been located and the domain 2c is transferred to the bit position where the domain 1c would otherwise have been located. This will readily be understood if FIG. 6A, illustrating the relation among the magnetic bubble domains before the exchange of the magnetic bubble domains, is compared with FIG. 6C, illustrating the same relation after the exchange of the magnetic bubble domains.

The magnetic bubble domain swap gate circuit of the present invention illustrated in FIGS. 5 and 6A through 6C will now be compared with the conventional magnetic bubble domain exchange circuit illustrated in FIGS. 2A and 2B and 3A through 3D.

In the conventional circuit shown in FIGS. 2A and 2B and 3A through 3D, in the major loop 1, the spacing between the "outlet" position for removing a magnetic bubble domain from the major loop for transfer to the minor loop (the position 1c in FIG. 3A) and the "inlet" position for receiving a magnetic bubble domain transferred from the minor loop to the major loop (the position 2c in FIG. 3D) has a length of 2 bits (that is, there are two major loop pattern elements between the major loop inlet and outlet positions, so that it requires a second revolution of the rotating magnetic field to propel a bubble circulating in the major loop across both elements), and in the minor loop, the spacing between the outlet position for removing a magnetic bubble domain from the minor looo for transfer to the major loop (the position 2c in FIG. 3A) and the inlet position for receiving the magnetic bubble domain transferred from the major loop to the minor loop (the position 1c in FIG. 3C) has a length of one bit (that is, there is only one minor loop pattern element between the minor loop inlet and outlet positions, so that a single revolution of the rotating magnetic field is sufficient to propel a bubble circulating in the minor loop across this element). In contrast, in the circuit of the present invention shown in FIGS. 5 and 6A through 6C, in the major loop 21, the spacing between the outlet position for removing a magnetic bubble domain from the major loop for transfer to the minor loop (the position 1c in FIG. 6A) and the position for receiving the magnetic bubble domain transferred from the minor loop to the major loop (the position 2c in FIG. 6C) has a length of one bit and in the minor loop 22, the spacing between the outlet position for removing a magnetic bubble domain from the minor loop for transfer to the major loop (the position 2c in FIG. 6A) and the inlet position for receiving the magnetic bubble transferred from the major loop to the minor loop (the position 2b in FIG. 6C, to which position the bubble 1c in FIG. 6C will move when the current in transmission control conductor 27 is cut and the magnetic field $H_D$ is rotated again to the 0, position, as previously discussed) has a length of 2 bits. More specifically, in the conventional magnetic bubble domain swap gate circuit, the spacing between the magnetic bubble domain inlet and outlet on the major loop side has a length of two bits and the spacing between the magnetic bubble domain inlet and outlet on the minor loop side has a length of one bit, whereas in the magnetic bubble domain swap gate circuit according to the present invention, the spacing between the magnetic bubble domain inlet and outlet on the major loop side has a length of one bit and the spacing between the magnetic bubble domain inlet and outlet on the minor loop side has a length of two bits. In short, the relation between the spacing bit lengths on the major loop side and minor loop side in the magnetic bubble domain swap gate circuit is reversed to that in the conventional magnetic bubble domain swap gate circuit.

In the present invention, since the spacing between the magnetic bubble domain inlet and outlet and on the side of the minor loop 22 has a length of two bits, a broad region can be provided for formation of the magnetic bubble domain exchange circuit, so that the pattern width of the transmission control conductor pattern 27 can be increased. This increases the amount of electric current that the transmission control conductor pattern can conduct, so that a sufficient operational margin can be obtained.

The reason why the spacing between the outlet and inlet on the side of the major loop 21 is adjusted to one bit in the present invention is that, by this arrangement, the magnetic bubble domain circuit can be operated so that the magnetic bubble domain in the major loop and the magnetic bubble domain in the minor loop are exchanged with each other, with each of the domains being transferred to the original bit position of the other. This manner of operation is indispensable for transferring the magnetic bubble domains on the major loop into a plurality of minor loops in parallel.

In the embodiment shown in FIG. 5, the length of the spacing between the magnetic bubble domain inlet and outlet on the minor loop side is adjusted to two bits, and it is indispensable that the spacing between the magnetic bubble domain inlet and outlet on the major loop side should have a length of one bit. Accordingly, in this embodiment, permalloy patterns having twice the length are used on the major loop side which ensure that said spacing has a one-bit length.

Although the width of the minor loop is increased because the spacing between the magnetic bubble domain inlet and outlet on the minor loop side has a length of 2 bits, the information density is not reduced since the minor loop has a folded structure as illustrated hereinbefore with reference to FIGS. 4A to 4F.

Figure 7:
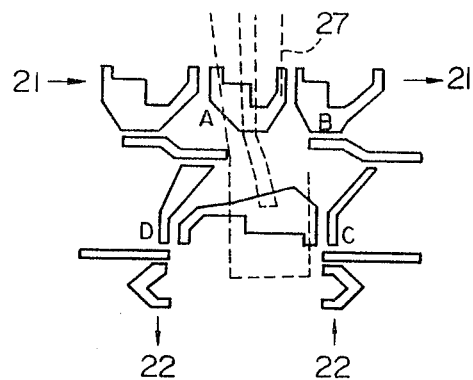
FIGS. 7 and 8 are plan views showing other embodiments of the bubble magnetic domain swap gate circuit according to the present invention.

As will be apparent from the foregoing illustration, in the present invention, the length of the magnetic substance pattern elements constituting the major loop is set longer than the length of the magnetic substance pattern elements constituting the minor loop, and the following bit length spacing relations (or number of times that a domain must be moved by the rotating magnetic field in order to transfer the domain from one place to another) are established:

$AB \leqq CD$, $AD = CD$ and $AB = BC$, wherein A represents the outlet to the minor loop in the major loop, B represents the inlet from the minor loop in the major loop, C represents the outlet to the major loop in the minor loop and D represents the inlet from the major loop in the minor loop. The relation of $AB \leqq CD$ is established in the embodiment shown in FIG. 5. An embodiment of the magnetic bubble domain exchange circuit in which the relation of $AB = CD$ is established is illustrated in FIG. 7. In FIG. 7, reference numerals 21, 22 and 27 represent the same elements as the elements 21, 22 and 27 in FIG. 5.

Figure 8:
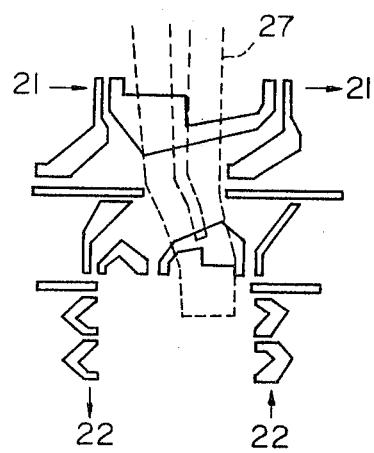

In each of the embodiments shown in FIGS. 5 and 7, the pitch or length of the permalloy patterns on the major loop side is twice the length of the permalloy patterns on the minor loop side. An embodiment of the magnetic bubble domain exchange circuit in which the permalloy patterns on the major loop side are four times the length of the permalloy patterns on the minor loop side is shown in FIG. 8. The mutual relation among the major loop 21 having such a 4-fold pitch pattern, a minor loop 22 and the conductor pattern 27 in this magnetic bubble domain exchange circuit is illustrated in FIG. 8. For example, in the embodiment shown in FIG. 8, the length of the major loop pattern elements is 32 μm and the length of the minor loop pattern elements is 8 μm.

The present invention has been described with reference to magnetic bubble domain swap gate circuit embodiments which have only the function of exchanging magnetic bubble domains. Needless to say, the present invention may also be applied to a magnetic bubble domain swap gate circuit which has not only this function of exchanging magnetic bubble domains, but also the function of dividing magnetic bubble domains.

As is seen from the foregoing illustrations, the magnetic bubble domain swap gate circuit of the present invention is characterized in that the length of the spacing between the magnetic bubble domain outlet and inlet on the minor loop side is set at two bits and the length of the spacing between the magnetic bubble domain outlet and inlet on the major loop side is set at one bit. By virtue of this characteristic feature, according to the present invention, the region for forming of the magnetic bubble domain swap gate circuit can be increased and the pattern width of the transmission control conductor pattern can be increased, with the result that the density of the electric current to be supplied to the conductor pattern can be increased and a sufficient operation margin can be obtained.

Furthermore, in the above-mentioned circuit structure according to the present invention, exchanging magnetic bubble domains in the major and minor loops while keeping the same bit position relationships therebetween is not prohibited at all.

What is claimed is:

1. A An improved magnetic bubble domain swap gate circuit comprising of the type which connects an information transmission line for transmitting a magnetic bubble domain and an information storage loop for storing the magnetic bubble domain wherein so that the magnetic bubble domain in the information transmission line is transmitted to the information storage loop and simultaneously, the magnetic bubble domain in the information storage loop is transmitted to the information transmission line, both the information transmission line and the information storage loops being formed of patterns of magnetic substance elements, wherein the improvement comprises: said magnetic bubble domain swap gate circuit being is arranged to that the magnetic substance elements of the information transmission line are longer than the magnetic substance elements of the information storage loop; and in the information transmission line having a longer magnetic substance pattern period than the magnetic substance pattern period of the information storage loop and in the information storage loop, the following relations are established in bit length spacings:

$$AB \leqq CD,$$

$$AD = CD \text{ and}$$

$$AB = BC,$$

wherein A represents an the outlet of the information transmission line to the information storage loop, B represents an the inlet of the information transmission line from the information storage loop, C represents an the outlet of the information storage loop to the information transmission line and D represents an the inlet of the information storage loop from the information transmission line.

2. The circuit of claim 1, wherein there is one information transmission line magnetic substance element between A and B, and wherein there are two information storage loop magnetic substance elements between C and D.

3. The circuit of claim 2, wherein the information storage loop is folded, so that at least a portion thereof has at least four rows of magnetic substance elements, said at least four rows being disposed substantially parallel to one another.

4. The circuit of claim 2, or 3 wherein the magnetic substance elements are formed of permalloy.

5. The circuit of claim 4, wherein the magnetic substance elements have convex sides and concave sides, the convex sides of a plurality of the magnetic substance elements of the information storage loop being substantially V-shaped.

6. The circuit of claim 4, wherein the magnetic substance elements have convex sides and concave sides, at least one of the information storage loop magnetic substance elements between C and D having an asymmetric convex side, and the information transmission line magnetic substance element between A and B having an asymmetric convex side.

7. The circuit of claim 6, further comprising a transmission control conductor pattern electrically insulated from the information transmission line and the information storage loop, the transmission control conductor pattern having first and second segments each traversing the information transmission line and extending toward the information storage loop, both the first and second segments of the transmission control conductor pattern traversing the information transmission line magnetic substance element between A and B.

8. The circuit of claim 7, wherein the information transmission line magnetic substance element between A and B is substantially twice as long as at least one of the information storage loop magnetic substance elements between C and D.

9. The circuit of claim 7, wherein the information transmission line magnetic substance element between A and B is substantially four times as long as at least one of the information storage loop magnetic substance elements between C and D.

10. The circuit of claim 9, wherein the information transmission line magnetic substance element between A and B is substantially 32 $\mu$m long and at least one of the information storage loop magnetic substance elements between C and D is substantially 8 $\mu$m long.

11. A magnetic bubble domain swap gate circuit for a magnetic bubble memory element having an information transmission line for transmitting magnetic bubbles, an information storage loop for storing magnetic bubbles, a portion of the information storage loop being positioned adjacent the information transmission line, and means for generating a periodically varying magnetic field to circulate magnetic bubbles along the information transmission line and the information storage loop, comprising: means for transferring a bubble at an outlet position on the information transmission line to an inlet position on the information storage loop while simultaneously transferring a bubble at an outlet position on the information storage loop to an inlet position on the information transmission line so as to place each bubble at the relative bit position previously occupied by the other, the inlet and outlet positions on the information transmission line being closer to each other than the distance that a bubble would be propelled by the varying magnetic field during two periods thereof and the inlet and outlet positions on the information storage loop being further from each other than the distance that a bubble would be propelled by the varying magnetic field during one period thereof, said means including a transmission control conductor pattern having first and second segments each traversing the information transmission line and extending toward the portion of the information storage loop that is positioned adjacent the information transmission line, those portions of the first and second segments that are nearest to each other where they traverse the information transmission line being substantially closer than a bubble would be propelled by the varying magnetic field during one period thereof.

12. The circuit of claim 11, wherein the information storage loop is folded, so that at least a portion thereof has at least four substantially parallel paths along which magnetic bubbles can circulate.

13. The circuit of claim 11, wherein the information storage loop is folded so as to lie along the periphery of one of a G-shaped region, an L-shaped region, a U-shaped region, a C-shaped region, and an S-shaped region.

14. The circuit of claim 11, 12, or 13, wherein the side of the information transmission line that is closest to the information storage loop and that lies between the inlet and outlet positions of the information transmission line is asymmetric, and wherein the side of the information storage loop that is closest to the information transmission line and that lies between the inlet and outlet positions of the information storage loop is asymmetric.

15. The circuit of claim 14, wherein both the information transmission line and the information storage loop are made of permalloy.

16. The circuit of claim 11, 12, or 13, wherein the information transmission line comprises a pattern of discrete permalloy elements, there being one information transmission line pattern element between the outlet and inlet positions of the information transmission line, wherein the information storage loop comprises a pattern of discrete permalloy elements, there being two information storage loop pattern elements between the outlet and inlet positions of the information storage loop, and wherein the means for generating a periodically varying magnetic field comprises means for generating a rotating magnetic field.

17. The circuit of claim 16, wherein the two information storage loop pattern elements between the outlet and inlet positions of the information storage loop have different shapes.

18. The circuit of claim 17, wherein a plurality of the pattern elements of the information storage loop have a concave side and a V-shaped convex side.

19. The circuit of claim 18, wherein the information transmission line pattern element between the outlet and inlet positions of the information transmission line has a concave side and a convex side that is asymmetric.

20. The circuit of claim 19, wherein the information transmission line pattern element between the outlet and inlet positions of the information transmission line is longer than at least one of the information storage loop pattern elements.

21. The circuit of claim 20, wherein the information transmission line pattern element between the outlet and inlet positions of the information transmission line is substantially twice as long as at least one of the information storage loop pattern elements between the outlet and inlet positions of the information storage loop.

22. The circuit of claim 20, wherein the information transmission line pattern element between the outlet and inlet positions of the information transmission line is substantially four times as long as at least one of the information storage loop pattern elements between the outlet and inlet positions of the information storage loop.

* * * * *

UNITED STATES PATENT AND TRADEMARK OFFICE
CERTIFICATE OF CORRECTION

PATENT NO. : 4,414,648                              Page 1 of 2
DATED     : November 8, 1983
INVENTOR(S) : Yanase It is certified that error appears in the above—identified patent and that said Letters Patent is hereby corrected as shown below:

Front page, [73], "Fumitsu" should be --Fujitsu--.
           [57], ABSTRACT, line 1, delete "(28)";
                            line 12, delete ",";
                            line 15, delete "(21)";
                            line 23, after "element" insert --,--;
                            line 25, after "manner" change "." to --:--.

Col. 6, line 23, "2c" should be --2d--;
       line 67, "looo" should be --loop--.

Col. 7, line 13, after "the" (first occurrence) insert --inlet--;
       line 24, "0" should be --$0°$--.

Col. 8, line 68, delete "of".
Col. 9, line 13, delete "A";
       line 14, delete "comprising";
       line 17, delete "wherein";

UNITED STATES PATENT AND TRADEMARK OFFICE
CERTIFICATE OF CORRECTION

PATENT NO. : 4,414,648         Page 2 of 2
DATED      : November 8, 1983
INVENTOR(S) : Yanase It is certified that error appears in the above—identified patent and that said Letters Patent is hereby corrected as shown below:

Col. 9, line 26, delete "being";
line 30, delete "having a longer magnetic substance pattern";
line 31, delete line;
line 32, delete "the information storage loop";
line 41, delete "an";
line 43, delete "an";
line 44, delete "an";
line 46, delete "an".

Signed and Sealed this

First Day of May 1984

[SEAL]

Attest:

GERALD J. MOSSINGHOFF

Attesting Officer     Commissioner of Patents and Trademarks